United States Patent [19]
Li

[11] Patent Number: 6,069,079
[45] Date of Patent: May 30, 2000

[54] EXPOSURE OF DESIRED NODE IN A MULTI-LAYER INTEGRATED CIRCUIT USING FIB AND RIE

[75] Inventor: Xia Li, Fremont, Calif.

[73] Assignee: Advanced Micro Devices, Inc., Sunnyvale, Calif.

[21] Appl. No.: 09/148,414

[22] Filed: Sep. 4, 1998

[51] Int. Cl.[7] .................................................. H01L 21/302
[52] U.S. Cl. .......................... 438/690; 438/700; 438/737
[58] Field of Search ..................................... 438/690, 689, 438/700, 710, 712, 714, 717, 736, 737, 734; 216/39, 94, 95

[56] References Cited

U.S. PATENT DOCUMENTS 5,616,921  4/1997  Talbot et al. ............................. 250/307
5,825,035  10/1998  Mizumura et al. ...................... 250/423

OTHER PUBLICATIONS

Wolf and Tauber, Silicon Processing for the VLSI Era vol. 1—Process Technology, 1986, Lattice Press, pp. 510–511 and Chapter 16.

*Primary Examiner*—Charles Bowers
*Assistant Examiner*—Evan Pert
*Attorney, Agent, or Firm*—Sawyer Law Group LLP

[57] ABSTRACT

Aspects for exposing local areas for desired nodes in a multi-layer integrated circuit are described. In an exemplary method aspect, the method includes exposing at least one desired local area using focused ion beam etching, and performing reactive ion etching to complete delayering of the at least one desired local area to gain access to at least one lower level node of the integrated circuit. The exposing step further includes using a high current ion beam in the focused ion beam etching.

12 Claims, 1 Drawing Sheet

EXPOSURE OF DESIRED NODE IN A MULTI-LAYER INTEGRATED CIRCUIT USING FIB AND RIE

FIELD OF THE INVENTION

The present invention relates to multi-layer integrated circuit (IC) devices, and more particularly to exposure of desired nodes within a multi-layer integrated circuit device.

BACKGROUND OF THE INVENTION

Bringing up lower level metal nodes of multi-layered IC devices is necessary for IC device modification or re-routing, as well as being useful for debugging and failure analysis. However, the task of bringing up these lower level metal nodes is often difficult and tedious, especially when desired or target metal nodes or layers are buried under other higher level or non-target metal nodes or layers. As a result, not only are target nodes difficult to access, but also, undesired shorts are difficult to prevent. To further complicate the situation, as the number of metal layers increases, the lower level metal nodes become increasingly thinner, and the node population becomes increasingly more dense. These conditions result in a decreased success rate reaching a desired lower level metal node.

Usually, one of two approaches is used to reach a target metal layer in an IC device. RIE (reactive ion etching) is generally used as a global delayering method. In RIE, a plasma etch normally removes passivation layers and dielectric layers to expose the metal layers of all the transistors in a given device. When attempting to achieve a non-uniform etching in which only desired portions of a device are exposed, over-etch problems may result.

Another method utilizes a FIB (focused ion beam) system. With FIB utilization, individual areas are exposed through the use of a focused ion beam. FIB techniques normally use a low level current, i.e., less than about 1000 picoamperes (pA), to open individual areas, e.g., windows of approximately 15 micron ($\mu$m)×15 $\mu$m. Unfortunately, such low levels of current result in significantly long time periods to open the windows, for example, on the order of thirty minutes per window. Further, when the FIB is used for desired nodes in lower levels if the FIB window is not opened wide enough, the depth of the trench formed by etching through the upper layers limits the detection of a signal coming back from the node during e-beam (electron beam) probing. Normally, the desired aspect ratio (ratio of height to width) of the trench is 1:1, which is difficult to achieve in the lower level nodes due to the narrow width and increased depth of the trenches.

Accordingly, what is needed is a method and system for exposing desired nodes at local areas efficiently and accurately. The present invention addresses such a need.

SUMMARY OF THE INVENTION

The present invention provides for exposure of local areas for desired nodes in a multi-layer integrated circuit. In an exemplary method aspect, the method includes exposing at least one desired local area using focused ion beam etching, and performing reactive ion etching to complete delayering of the at least one desired local area to gain access to at least one lower level node of the integrated circuit. The exposing step further includes using a high current ion beam in the focused ion beam etching.

Through the present invention, more efficient node exposure is achieved through a high beam current from a FIB system for opening individual windows followed by global delayering interlayer dielectric material with RIE techniques. With multiple local areas opened using FIB etching being processed substantially simultaneously with RIE, the benefits of both techniques are effectively utilized in reaching desired nodes. These and other advantages of the aspects of the present invention will be more fully understood in conjunction with the following detailed description and accompanying drawings.

DETAILED DESCRIPTION

The present invention relates to exposing desired nodes in multi-layer integrated circuits devices. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
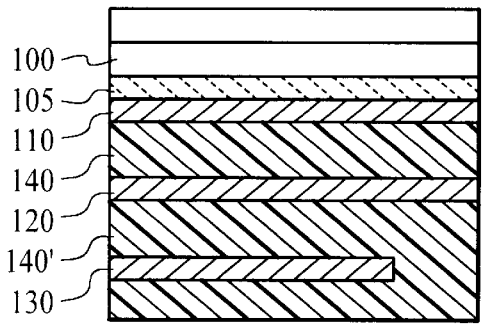
FIG. 1 illustrates a partial cross-section of a multi-layer integrated circuit.

FIG. 1 presents a partial cross-sectional view of a multi-layer integrated circuit. As shown in FIG. 1, a multi-layer integrated circuit comprises several layers, including a protective top-layer 100, e.g., a polyimide layer, a passivation $Si_3N_4/SiO_2$ layer 105, third metal layer 110, second metal layer 120, and first metal layer 130, with the metal layers being separated by suitable inter layer dielectrics (ILD) 140, 140'. Silicon dioxide ($SiO_2$) or silicon nitride ($Si_3N_4$) is typically utilized for the ILD material. For illustrative purposes, exposure of a desired node at a local area in accordance with the present invention is described with reference to an overall flow diagram of processing steps shown in FIG. 2 in conjunction with FIGS. 3 and 4, which illustrate partial cross-sectional views of a multi-layer integrated circuit during the steps of the processing.

Figure 3:
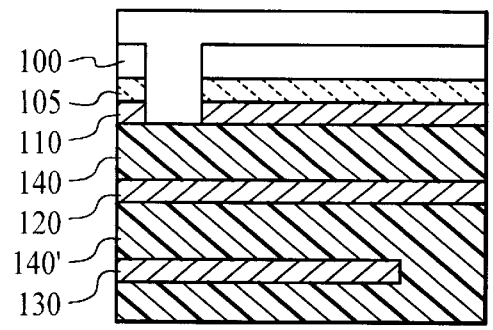
FIG. 3 illustrates a partial cross-section of a multi-layer IC following step 150 of FIG. 2.
Figure 2:
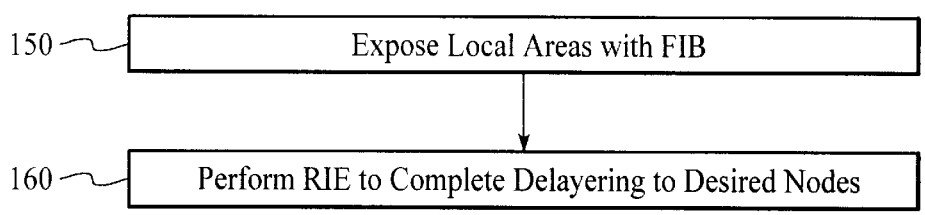
FIG. 2 illustrates a flow diagram of exposing desired nodes in accordance with the present invention.

Referring to FIG. 2, exposure of desired nodes at local areas initiates through FIB utilization (step 150). In a preferred embodiment, a beam current of greater than about 2700 pA is used to remove the protective polyimide layer 100, the passivation layer and top metal layer 110, as shown in FIG. 3. With the use of a higher beam current, significantly less time is needed to open a window in the IC using the FIB, e.g., around 5 minutes per window. The ion beam source is suitably a Gallium ion beam provided at about 30 keV (kiloelectronvolts). Preferably, the FIB is utilized successively in different areas for the varying nodes being accessed. With the increase in beam current and corresponding decrease in time for FIB etching, the FIB system is more efficiently and effectively utilized.

Figure 4:
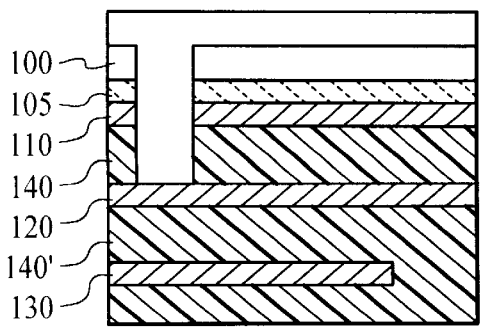
FIG. 4 illustrates a partial cross-section of a multi-layer IC following step 160 of FIG. 2.

Once the FIB has been utilized to open at least one window, the process of exposing the desired node(s) continues with RIE of the IC (step 160). By way of example, FIG. 4 illustrates how the RIE results in the removal of the ILD 140 to expose the desired node, metal layer 120. Since the polyimide layer 100 etches much more slowly than the ILD layers, with using the RIE etching recipe to remove $SiO_2$, the polyimide suitably acts like a mask during the RIE processing, so that only the areas opened with the FIB are effectively etched. The etch conditions for the RIE step 160 are standard and well-known to those of skill in the art. Thus, a desired lower level node in a multi-layer IC is capably exposed through advantageous utilization of the beneficial aspects of FIB and RIE techniques in a straightforward and efficient manner.

Figure 5:
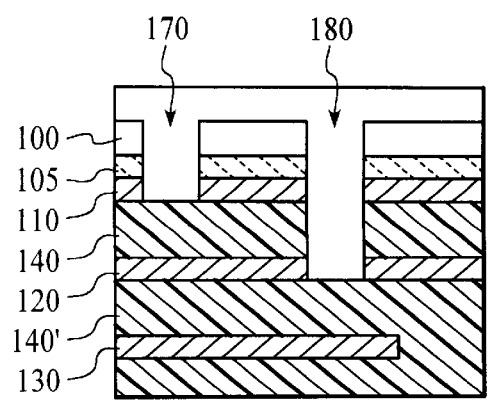
FIG. 5 illustrates a partial cross-section of a multi-layer IC following FIB etching for an alternate embodiment of the present invention.

Since the FIB may be utilized successively to open multiple windows at desired locations in an IC, the subsequent RIE exposure step acts to globally delayer the IC to allow massive production and less impact on the upper metal layers. In an alternate embodiment, the multiple windows may be selectively opened using the higher current FIB techniques to different levels of metal layers, as shown in FIG. 5. Referring to FIG. 5, two windows, 170 and 180, are exposed through individual utilization of the FIB etching. For window 170, the FIB etch step suitably removes the polyimide layer 100, the passivation layer and top metal layer 110, as previously described. For window 180, the FIB etch step suitably removes layers 100 and 110, along with ILD layer 140 and second metal layer 120. The subsequent RIE step then removes the ILD layer 140' and ILD layer 140 to expose the desired node of first metal layer 130 for window 180 and of the second layer metal 120 for window 170.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for exposing local areas for desired nodes in a multi-layer integrated circuit, the method comprising:

exposing at least one desired local area using focused ion beam etching; and performing reactive ion etching to complete delayering of the at least one desired local area to gain access to at least one lower level node of the integrated circuit.

2. The method of claim 1 wherein the exposing step further comprises using a high current ion beam in the focused ion beam etching.

3. The method of claim 2 wherein the high current ion beam comprises a beam of at least about 2700 picoamperes.

4. The method of claim 1 wherein the step of exposing removes a polyimide layer, the passivation layer and at least a top metal layer of the integrated circuit.

5. The method of claim 1 wherein the step of performing reactive ion etching etches at least one level of interlayer dielectric material.

6. A method for exposing desired nodes of a multi-layer integrated circuit (IC) device more efficiently, the method comprising:

performing focused ion beam etching to expose at least two local areas, each of the at least two local areas being etched to different layers of the multi-layer IC device; and performing reactive ion etching to complete delayering to a desired node layer beneath the different layers.

7. The method of claim 6 exposing a first local area to a first chosen layer using focused ion beam etching;

exposing a second local area to a second chosen layer using focused ion beam etching; and performing reactive ion etching to complete delayering to a first desired node layer beneath the first chosen layer and to a second desired node layer beneath the second chosen layer to gain access to the first and second desired node layers.

8. The method of claim 6 wherein a polyimide layer in a topmost layer of the a device acts as a mask during the step of performing reactive ion etching.

9. The method of claim 7 wherein a first chosen layer comprises a first interlayer dielectric layer.

10. The method of claim 9 wherein a second chosen layer comprises a second interlayer dielectric layer.

11. The method of claim 6 wherein performing focused ion beam etching further comprises utilizing a high current ion beam.

12. The method of claim 11 wherein the high current ion beam comprises an ion beam provided at at least about 2700 picoamperes.

* * * * *